(12) United States Patent
Sunaoshi

(10) Patent No.: US 7,977,654 B2
(45) Date of Patent: Jul. 12, 2011

(54) WRITING APPARATUS AND WRITING METHOD

(75) Inventor: Hitoshi Sunaoshi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 252 days.

(21) Appl. No.: 12/417,933

(22) Filed: Apr. 3, 2009

(65) Prior Publication Data
US 2009/0258317 A1   Oct. 15, 2009

(30) Foreign Application Priority Data

Apr. 9, 2008   (JP) ................. 2008-101020

(51) Int. Cl.
*H01J 37/302* (2006.01)
(52) U.S. Cl. .................... 250/492.22; 250/492.23
(58) Field of Classification Search ............. 250/492.22, 250/492.23, 398, 492.2
See application file for complete search history.

(56) References Cited

U.S. PATENT DOCUMENTS
6,896,186 B2 * 5/2005 Kudo .............. 235/462.11
2009/0194710 A1 * 8/2009 Shibata ............ 250/492.2

FOREIGN PATENT DOCUMENTS
JP   2001-92110   4/2001
JP   2007-233164  9/2007

OTHER PUBLICATIONS
U.S. Appl. No. 12/343,997, filed Dec. 24, 2008, Hitoshi Sunaoshi.

* cited by examiner

*Primary Examiner* — Kiet T Nguyen
(74) *Attorney, Agent, or Firm* — Oblon, Spivak, McClelland, Maier & Neustadt, L.L.P.

(57) ABSTRACT

A writing apparatus includes a writing unit configured to a write a pattern onto a target workpiece, based on a writing data of the pattern to be written on the target workpiece, and a generation unit configured generate, after the pattern has been written, writing data of a figure code indicating a writing information of when the target workpiece is written, based on the writing information, wherein the writing unit further writes the figure code onto the target workpiece, based on the writing data of the figure code.

10 Claims, 10 Drawing Sheets

```
LAYOUTNAME= "AAAA"
ID0= "123456"
ID1= "INPUTDATE"
ID2= "WRITER_123-EUVPLATE-PEB_33-DZV_11"
ID3= "LAYOUTNAME"
ID4= "WRITEDATE"
ID5= "OPERATOR"
MASK_SIZE=6
DOSE=10
ID_DIMENSION=QR
ID_SIZE=25
ID_X=-70000
ID_Y=-70000
CHIP1_SIZE=10000
CHIP1_X=-50000
CHIP1_Y=-50000
CD_CORRECTION=ON
       ⋮
```

FIG. 3

WRITING APPARATUS AND WRITING METHOD

CROSS-REFERENCE TO RELATED APPLICATION

This application is based upon and claims the benefit of priority from the prior Japanese Patent Application No. 2008-101020 filed on Apr. 9, 2008 in Japan, the entire contents of which are incorporated herein by reference.

BACKGROUND OF THE INVENTION

1. Field of the Invention

The present invention relates to a writing apparatus and a writing method. For example, it relates to a writing apparatus which writes a pattern onto a target workpiece by using electron beams, and to a method thereof.

2. Description of Related Art

The microlithography technique which advances microminiaturization of semiconductor devices is extremely important as being the only process of forming patterns in semiconductor manufacturing processes. In recent years, with high integration of large-scale integrated circuits (LSI), a line width (critical dimension) required for semiconductor device circuits is shrinking year by year. In order to form a desired circuit pattern on such semiconductor devices, a master or "original" pattern (also called a mask or a reticle) of high precision is required. Then, the electron beam writing technique intrinsically having excellent resolution is used for producing such a highly precise master pattern.

FIG. 12 is a schematic diagram showing operations of a variable-shaped electron beam (EB) type writing apparatus. As shown in FIG. 12, the variable-shaped electron beam writing apparatus, including two aperture plates, operates as follows: A first aperture plate 410 has a quadrangular such as rectangular opening or "hole" 411 for shaping an electron beam 330. A second aperture plate 420 has a variable-shaped opening 421 for shaping the electron beam 330 that has passed through the opening 411 into a desired rectangular shape. The electron beam 330, emitted from a charged particle source 430 and having passed through the opening 411, is deflected by a deflector, to pass through a part of the variable-shaped opening 421 and thereby to irradiate a target workpiece or "sample" mounted on a stage which continuously moves in one predetermined direction (e.g. X direction) during writing or "drawing." In other words, a rectangular shape formed as a result of passing through both the opening 411 and the variable-shaped opening 421 is written in the writing region of a target workpiece 340 on the stage. This method of forming a given shape by letting beams pass through both the opening 411 and the variable-shaped opening 421 is referred to as a variable shaped method.

On a mask serving as a target workpiece, an identification (ID) figure for identifying the mask itself is written in the outside of the chip region for manufacturing a semiconductor. For example, the identification figure is written as a barcode pattern (refer to, e.g., Japanese Patent Application Laid-open (JP-A) No. 2001-92110). As another example, there is disclosed that a pattern formed by encoding information which is for inspecting a photomask is formed on the photomask (refer to, e.g., Japanese Patent Application Laid-open (JP-A) No. 2007-233164). Conventionally, since such an ID figure and an encoded pattern are formed in advance by using CAD etc., it is impossible to write information, such as information of just before writing or an actual writing time and date. Furthermore, of course, it is also impossible to write information of after starting writing. However, when performing processing and a defect inspection after writing a mask, there may be needed mask substrate information and/or information of when writing the mask. Conventionally, such information is managed independently from the mask substrate, and stored in the database etc. However, there is a strong request from the user to write such information on the mask as much as possible.

Thus, as mentioned above, it is strongly requested to write information, such as mask substrate information and information of when writing a mask, onto the mask as much as possible. However, conventionally, since figure data indicating an ID figure needs to be separately created in an external device in advance as well as pattern data for manufacturing a semiconductor, etc., it has been difficult to incorporate information produced after then, such as information of just before writing and information of when writing.

BRIEF SUMMARY OF THE INVENTION

It is an object of the present invention to provide a writing apparatus which can write information, such as information of just before writing and information of when writing, together with a pattern, and to provide a method thereof.

In accordance with one aspect of the present invention, a writing apparatus includes a writing unit configured to write a pattern onto a target workpiece, based on a writing data of a pattern to be written on the target workpiece, and a generation unit configured to generate, after the pattern has been written, writing data of a figure code indicating a writing information of when the target workpiece is written, based on the writing information, wherein the writing unit further writes the figure code onto the target workpiece, based on the writing data of the figure code.

In accordance with another aspect of the present invention, a writing method includes inputting writing data of a pattern to be written onto a target workpiece, and writing the pattern onto the target workpiece, based on the writing data, inputting, after the writing the pattern, writing information of when the target workpiece is written, and generating writing data of a figure code indicating the writing information, based on the writing information, and writing the figure code onto the target workpiece, based on the writing data of the figure code.

BRIEF DESCRIPTION OF THE DRAWINGS

FIG. 3 shows an example of a JOB file according to Embodiment 1;

DETAILED DESCRIPTION OF THE INVENTION

In the following Embodiments, a structure using an electron beam as an example of a charged particle beam will be described. The charged particle beam is not limited to the electron beam. Another charged particle beam, such as an ion beam, may also be used. Moreover, as an example of a charged particle beam apparatus, a variable shaped type electron beam writing apparatus will be particularly described. While an electron beam pattern writing apparatus will be described hereafter as an example, it is not limited thereto, and the description can also be applied to a laser mask writing apparatus.

Embodiment 1

Figure 1:
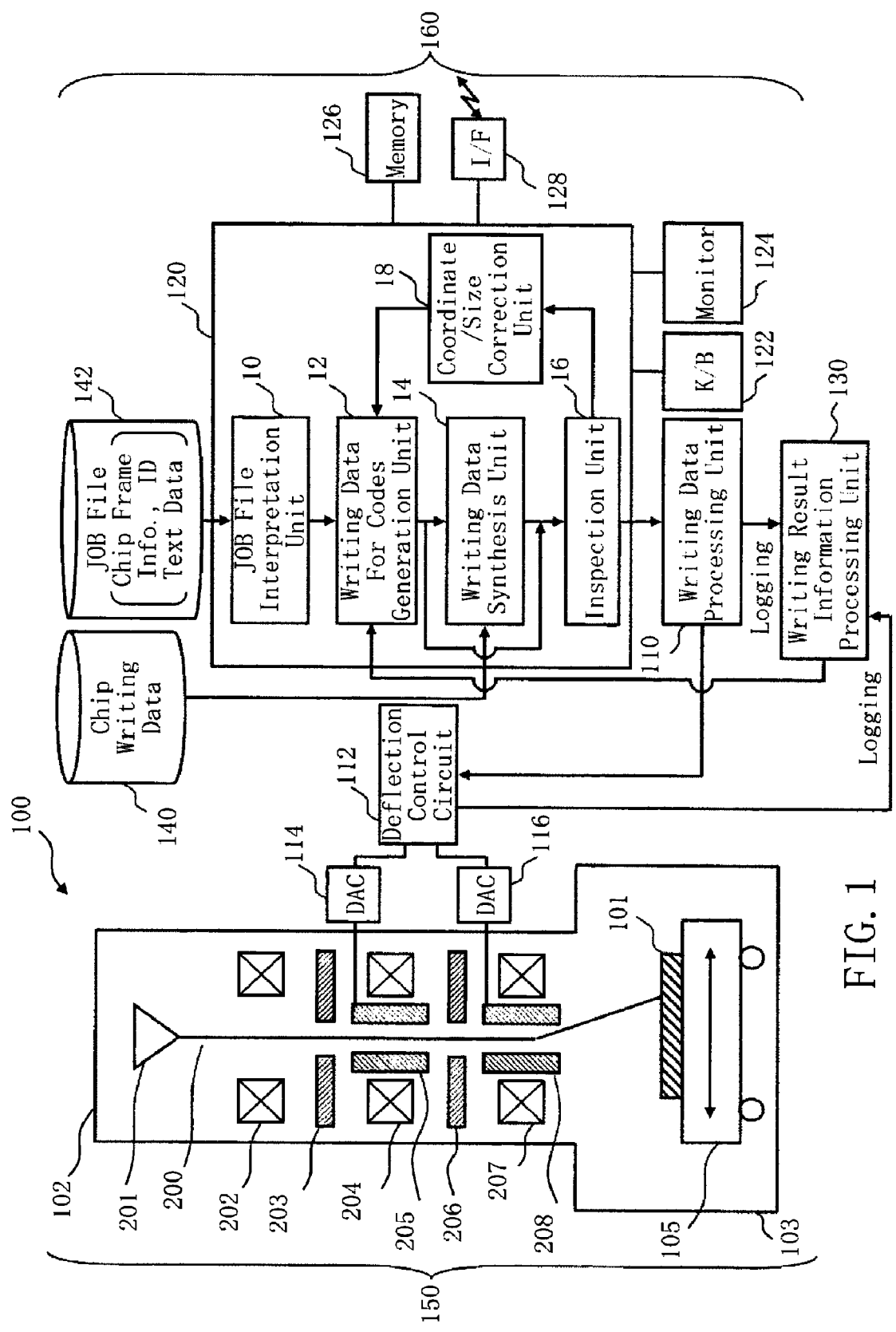
FIG. 1 is a schematic diagram showing a structure of a writing apparatus according to Embodiment 1.

FIG. 1 is a schematic diagram showing a structure of a pattern writing apparatus according to Embodiment 1. In FIG. 1, a writing apparatus 100 includes a writing unit 150 and a control unit 160. The writing apparatus 100 is an example of a charged particle beam writing apparatus. The writing apparatus 100 writes a predetermined pattern onto a target workpiece 101. The writing unit 150 includes a writing chamber 103 and an electron lens barrel 102 arranged above the writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is arranged an XY stage 105, on which the target workpiece 101 serving as a writing object is placed. The target workpiece 101 is, for example, a mask for exposing or "transferring and printing" a pattern onto a wafer forming a semiconductor device. Such a mask may be a mask blank where no patterns are formed, for example. The control unit 160 includes a writing data processing unit 110, a deflection control circuit 112, digital-to-analog converters (DAC) 114 and 116, a control computer 120, a keyboard (K/B) 122, a monitor 124, a memory 126, an interface (I/F) circuit 128, a writing result information processing unit 130, and magnetic disk drives 140 and 142. The writing data processing unit 110, the deflection control circuit 112, the control computer 120, the K/B 122, the monitor 124, the memory 126, the I/F circuit 128, and the magnetic disk drives 140 and 142 are connected with each other by a bus (not shown).

The DACs 114 and 116 are connected to the deflection control circuit 112. In the control computer 120, there are arranged a JOB file interpretation unit 10, a writing data for codes generation unit 12, a writing data synthesis unit 14, an inspection unit 16, and a coordinate/size correction unit 18. In the control computer 120 of FIG. 1, processing of each function, such as the JOB file interpretation unit 10, the writing data for codes generation unit 12, the writing data synthesis unit 14, the inspection unit 16, and the coordinate/size correction unit 18 may be implemented by software. Alternatively, each function of them may be configured by hardware such as an electric circuit. Alternatively, they may be executed by a combination of hardware and software, or a combination of hardware and firmware. When implemented by software or a combination of software and hardware etc., data to be input into the control computer 120 or each data being processed or having been processed is stored in the memory 126 each time. While FIG. 1 shows only the structure elements necessary for explaining Embodiment 1, it should be understood that other structure elements generally necessary for the pattern writing apparatus 100 may also be included.

When writing with an electron beam, layout of a semiconductor integrated circuit is first designed, and layout data (design data), in which pattern layout is defined, is generated. Then, the layout data is converted in an external conversion device so as to generate writing data (chip writing data) which can be input into the pattern writing apparatus 100. The chip writing data for writing a predetermined pattern onto a target workpiece is input in the magnetic disk drive 140 serving as an example of a storage unit. In performing writing processing, the contents of processing commands are created as a JOB file. The JOB file is stored in the magnetic disk drive 142 used as an example of a storage unit, through the I/F circuit 128. Alternatively, the operator may input file contents through the K/B 122 used as an input means, and then the created file may be stored in the magnetic disk drive 142. Identification information for identifying a target workpiece (mask), which is currently to be written, is defined as text data (ID text data) in the JOB file. Moreover, since the contents of the JOB file can be displayed on the monitor 124, the operator is able to input, delete, or correct the information through the K/B 122 used as an input means. It is preferable that information (size, position) of a chip frame in which chip writing data is written is also defined in the JOB file.

Figure 2:
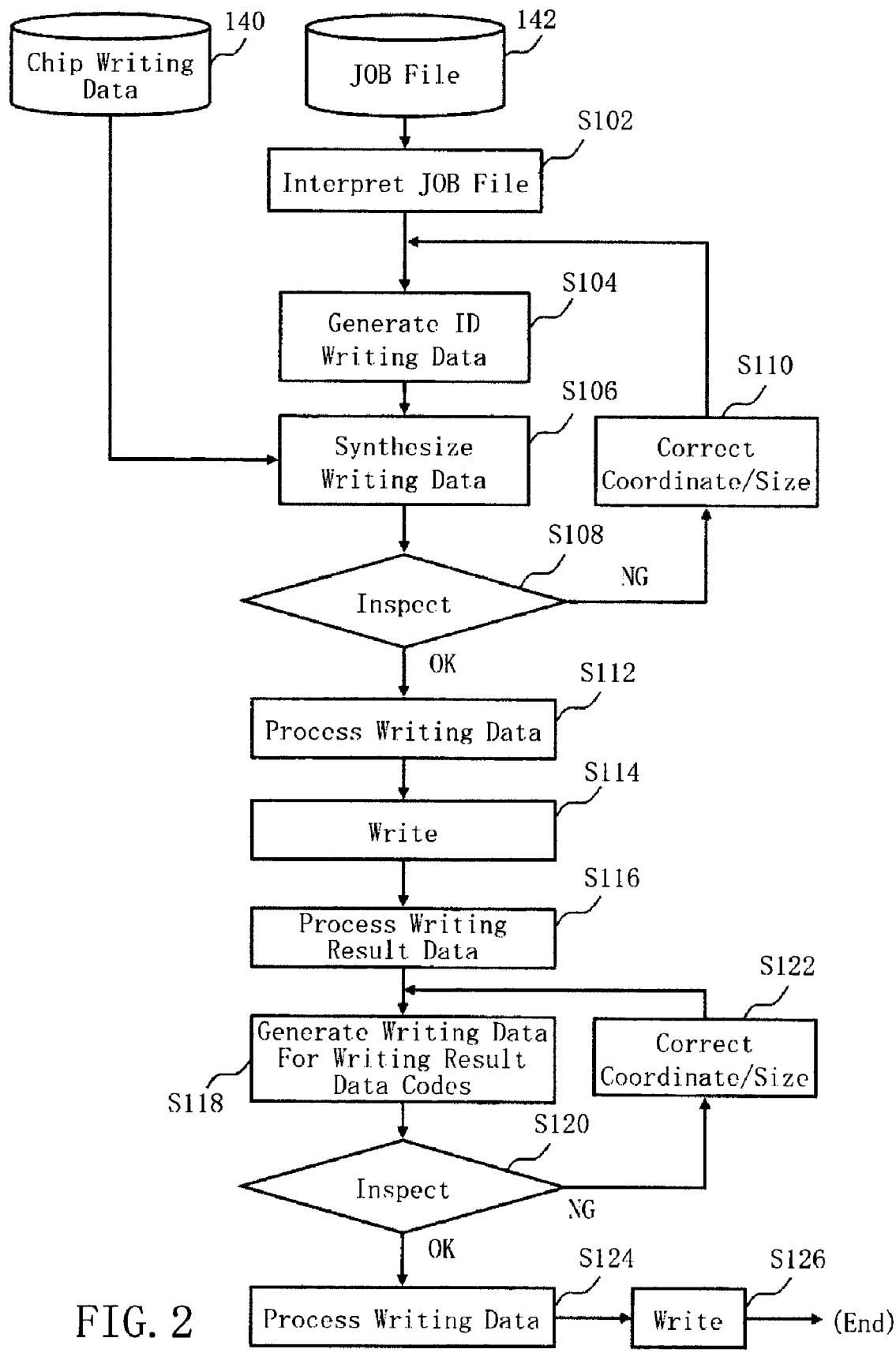
FIG. 2 is a flowchart showing main steps of a writing method according to Embodiment 1.

FIG. 2 is a flowchart showing main steps of a writing method according to Embodiment 1. In FIG. 2, the writing method executes a series of steps of a JOB file interpretation step (S102), an ID writing data generation step (S104), a writing data synthesis step (S106), an inspection step (S108), a coordinate/size correction step (S110), a writing data processing step (S112), a writing step (S114), a writing result data processing step (S116), a writing data generation step for writing result information codes (S118), an inspection step (S120), a coordinate/size correction step (S122), a writing data processing step (S124) and a writing step (S126)

In step S102, as a JOB file interpretation step, the JOB file interpretation unit 10 reads a JOB file from the magnetic disk drive 142, and, while interpreting the contents of the JOB file, checks whether there is ID text data or not.

FIG. 3 shows an example of the JOB file according to Embodiment 1. In FIG. 3, a layout name indicated as "LAYOUTNAME" is defined in a JOB file 20. The layout name is input as "AAAA", for example. Furthermore, information for identifying the target workpiece 101 itself is defined as ID text data 0 which is indicated as "ID0". For example, a serial number is used for the information for identifying the target workpiece 101 itself. In this case, for example, it is indicated as "123456", which may be automatically generated by the writing apparatus 100, or input by the operator through the K/B 122. Furthermore, as ID text data 1 indicated as "ID1", the time and date at which the writing data is input into the pattern writing apparatus 100 is defined. In FIG. 3, the input time and date is indicated as "INPUTDATE", for example. It is preferable that the input time and date is automatically input from the clock function installed in the control unit 160 in the pattern writing apparatus 100. Of course, it may be input by the operator through the K/B 122. Furthermore, as ID text data 2 indicated as "ID2", a serial number of the writing apparatus 100 into which the data is input, a type of the mask substrate, a serial number of a PEB apparatus to be used as a process after writing, and a serial number of a developing device are defined. In the case of FIG. 3, the serial number (identification information) of the pattern writing apparatus 100 is indicated as "WRITER_123", for example. The type of the mask substrate is indicated as "EUVPLATE", for example. The serial number of the PEB apparatus is indicated as "PEB_33", for example. The serial number of the developing device is indicated as "DZV_11", for example. Furthermore, as ID text data 3 indicated as "ID3", the layout name (name of writing data) defined by "AAAA" mentioned above is input automatically.

Moreover, as ID text data 4 indicated as "ID4", a writing time and date at which writing processing is actually started is defined. In the case of FIG. 3, the writing time and date is indicated as "WRITEDATE", for example. It is preferable that the writing time and date is automatically input from the clock function installed in the control unit 160 in the pattern writing apparatus 100. Of course, it may be input by the operator through the K/B 122. Furthermore, as ID text data 5 indicated as "ID5", the name of an operator of the writing apparatus 100 which writes a target mask is defined. The operator name is indicated as "OPERATOR", for example. The operator name may be input through the K/B 122 by the operator, for example. Of course, if the operator name is known in advance, it may be defined beforehand. Moreover, the size of the mask indicated as "MASKSIZE" is defined. In the case of FIG. 3, the mask size is input as "6", for example. Furthermore, a dose amount indicated as "DOSE", which is an amount irradiated when writing, is defined. The dose amount is input as "10", for example. Furthermore, as ID text data indicated as "ID_DIMENSION", the standard of an ID figure used when figuring the ID text data to be written is defined. In FIG. 3, the standard of the ID figure is indicated as "QR", for example. Furthermore, as ID text data indicated as "ID_SIZE", the size of the ID figure is defined. The size of the ID figure is indicated as "25", for example. Furthermore, as ID text data indicated as "ID_X", the X coordinate of the reference position of the ID figure is defined. The X coordinate of the reference position of the ID figure is indicated as "−70000", for example. Moreover, as ID text data indicated as "ID_Y", the Y coordinate of the reference position of the ID figure is defined. The Y coordinate of the reference position of the ID figure is indicated as "−70000", for example.

Furthermore, as chip frame information indicated as "CHIP1_SIZE", the size (chip frame size) of a chip pattern to be originally written is defined. In FIG. 3, the chip frame size is indicated as "10000", for example. Furthermore, as chip frame information indicated as "CHIP1_X", the X coordinate of the reference position (chip frame reference position) of a chip pattern to be originally written is defined. The X coordinate of the reference position of the chip pattern is indicated as "−50000", for example. Furthermore, as chip frame information indicated as "CHIP1_Y", the Y coordinate of the reference position of a chip pattern to be written is defined. The Y coordinate of the reference position of the chip pattern is indicated as "−50000", for example. In addition, whether to correct a CD dimension indicated as "CD_CORRECTION" or not is defined in the JOB file 20.

In step S104, as an ID writing data generation step, the writing data for codes generation unit 12 is input with ID text data in the JOB file 20, which is the data for specifying the shape of an ID figure (identification figure) indicating identification information of a mask, and generates writing data (ID writing data) of the ID figure based on the ID text data. The writing data for codes generation unit 12 generates the ID writing data of the ID figure using the same format as that of chip writing data, based on the ID text data.

Figure 4:
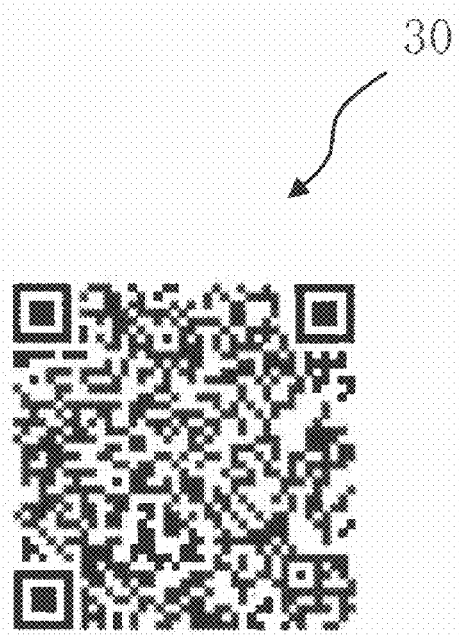
FIG. 4 shows an example of an ID figure according to Embodiment 1.

FIG. 4 shows an example of the ID figure according to Embodiment 1. The case of generating an ID FIG. 30 by using a "QR Code" (registered trademark (R)) is shown in FIG. 4 as an example. However, the standard of the ID figure is not limited to "QR Code" (R).

Figure 5:
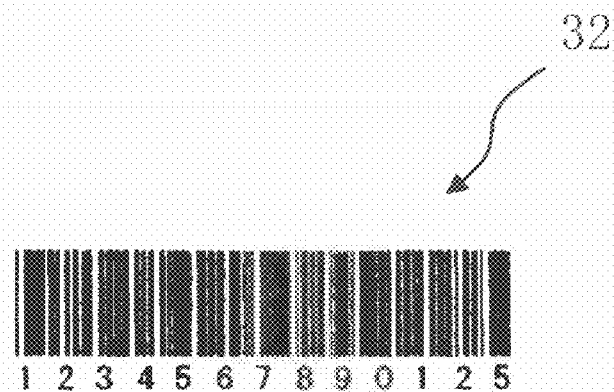
FIG. 5 shows another example of the ID figure according to Embodiment 1.

FIG. 5 shows another example of the ID figure according to Embodiment 1. The case of generating an ID FIG. 32 by using a "bar code" is shown in FIG. 5 as an example. As other standards, existing standards, such as "PDF417", "DataMatrix", "Maxi", or "Code" may be used. As an ID figure, a one-dimensional figure or a two-dimensional figure may be used. What is necessary is that an ID figure, which is written based on generated ID writing data, indicates identification information of the mask.

In step S106, as a writing data synthesis step, the writing data synthesis unit 14 reads chip writing data from the magnetic disk drive 140, inputs the generated ID writing data, and synthesizes both the data.

Figure 6A:
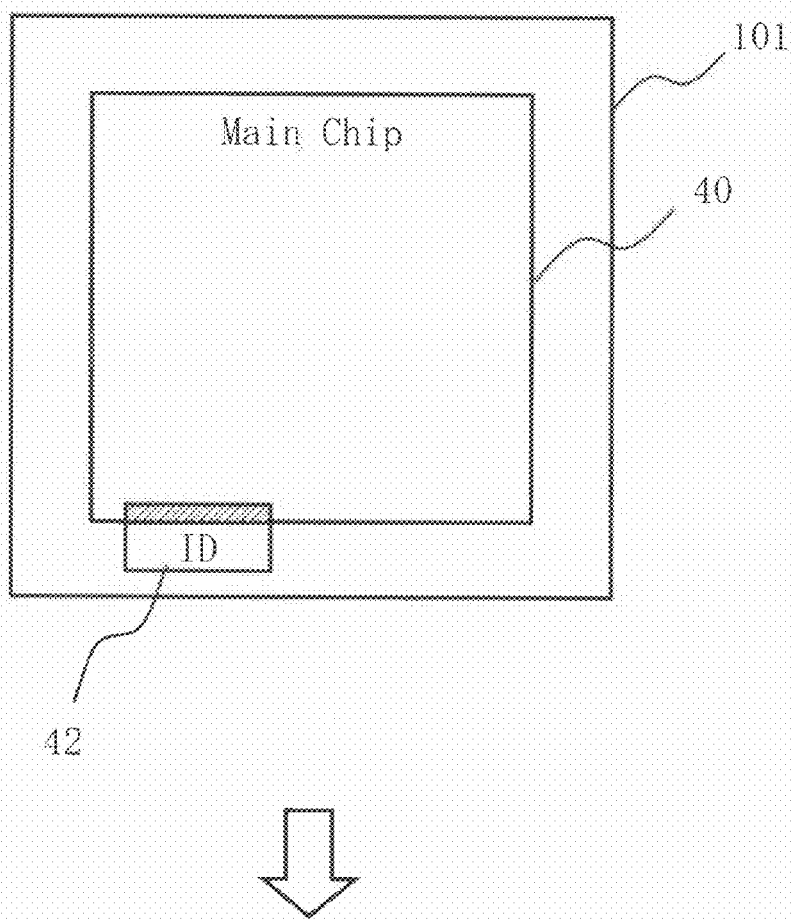
FIGS. 6A and 6B are schematic diagrams for explaining contents of inspection according to Embodiment 1.
Figure 6B:
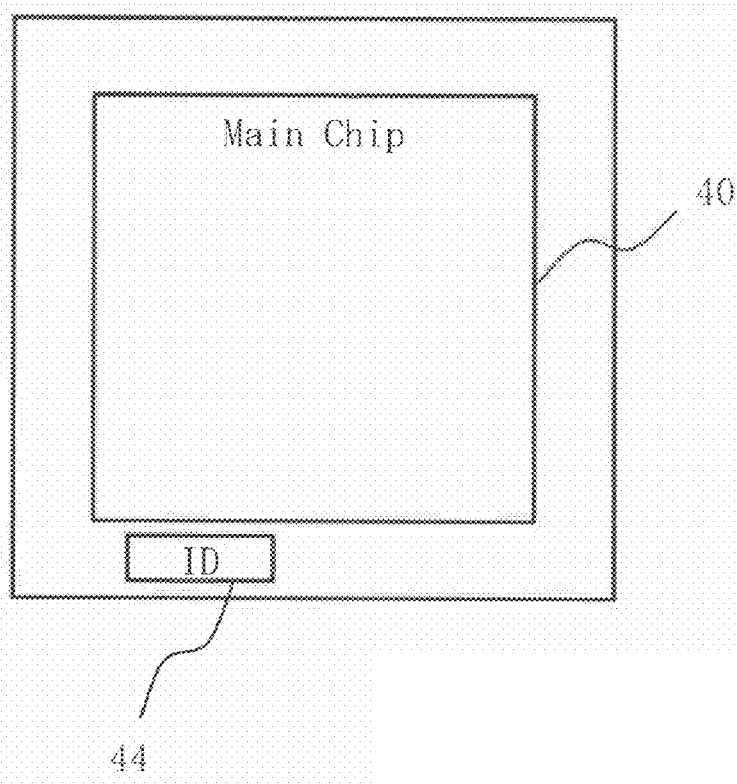

In step S108, as an inspection step, the inspection unit 16 inspects whether the chip pattern indicated by chip writing data overlaps with the ID figure indicated by ID writing data or not. FIGS. 6A and 6B are schematic diagrams for explaining the contents of inspection according to Embodiment 1. FIG. 6A shows the state where an ID FIG. 42 overlaps with a chip frame 40 of the target workpiece 101. In this case, the inspection unit 16 judges to be NG (no good) as an inspection result. Then, it goes to step S110. On the other hand, FIG. 6B shows the state where an ID FIG. 44 does not overlap with the chip frame 40 of the target workpiece 101. In this case, the inspection unit 16 judges to be OK as an inspection result. Then, it goes to step S112. This overlap inspection may be performed based on synthesized writing data. As another method, it is also suitable that the inspection unit 16 is input with frame information on a pattern to be written on the target workpiece, such as a chip frame size and a reference position of the chip frame defined in the JOB file 20, and inspects whether the chip pattern overlaps with the ID figure or not, based on the chip frame size, the reference position of the chip frame, the reference position of the ID figure, and the ID figure size.

In step S110, as a coordinate/size correction step, when the ID FIG. 42 overlaps with the chip frame 40, the coordinate/size correction unit 18 corrects the reference position of the ID figure or the ID figure size defined in the JOB file 20. After correcting the data of the JOB file 20, it returns to step S104. Repeating each step from S104 to S108 mentioned above, correction is automatically performed so that the ID FIG. 44 may not overlap with the chip frame 40 as shown in FIG. 6B.

In step S112, as a writing data processing step, the writing data processing unit 110 converts, by performing several conversion process steps, the synthesized writing data to data of the format of the pattern writing apparatus 100.

In step S114, as a writing step, the writing unit 150 writes a chip pattern and an ID figure on the target workpiece 101 by using data whose processing has been completed based on the synthesized writing data. The operation of the writing is specifically described as follows:

An electron beam 200 emitted from the electron gun assembly 201 irradiates the entire first aperture plate 203 having an opening in the shape of a quadrangle such as a rectangle by the illumination lens 202. At this point, the electron beam 200 is shaped to be a quadrangle such as a rectangle. Then, after having passed through the opening of the first aperture plate 203, the electron beam 200 of a first aperture image is projected onto the second aperture plate 206 by the projection lens 204. The position of the first aperture image on the second aperture plate 206 is deflection-controlled by the deflector 205, so as to change the shape and size of the beam. At this point, the deflector 205 is controlled by the deflection control circuit 112 through the DAC 114, to form the electron beam 200 consequently. After having passed through the opening of the second aperture plate 206, the electron beam 200 of a second aperture image is focused by the objective lens 207 and deflected by the deflector 208 which is controlled by the deflection control circuit 112 through the DAC 116. Moreover, the deflection control circuit 112 is controlled by a control signal output based on the data processed by the writing data processing unit 110. As a result, the electron beam 200 reaches a desired position on the target workpiece 101 placed on the XY stage 105 which moves continuously.

According to Embodiment 1, as mentioned above, conversion from text data to ID writing data for identifying the target workpiece 101 is performed in the pattern writing apparatus 100. After the conversion, an ID figure can be written as it is. Therefore, what is necessary is just to input text data into the pattern writing apparatus 100 without the necessity of generating writing data in advance. Therefore, information of just before writing can be incorporated as ID text data.

Furthermore, writing information (writing result information) obtained from the result produced after starting writing is also written as a figure code onto the target workpiece 101. Hereafter, it will be described concretely.

In step S116, as a writing result data processing step, after a pattern is written onto the target workpiece 101, the writing result information processing unit 130 inputs a log of each data of after starting writing from the deflection control circuit 112 and the writing data processing unit 110. Then, the writing result information processing unit 130 performs data processing of the input log, to create a writing information file of when the pattern is written onto the target workpiece 101.

Figure 7:
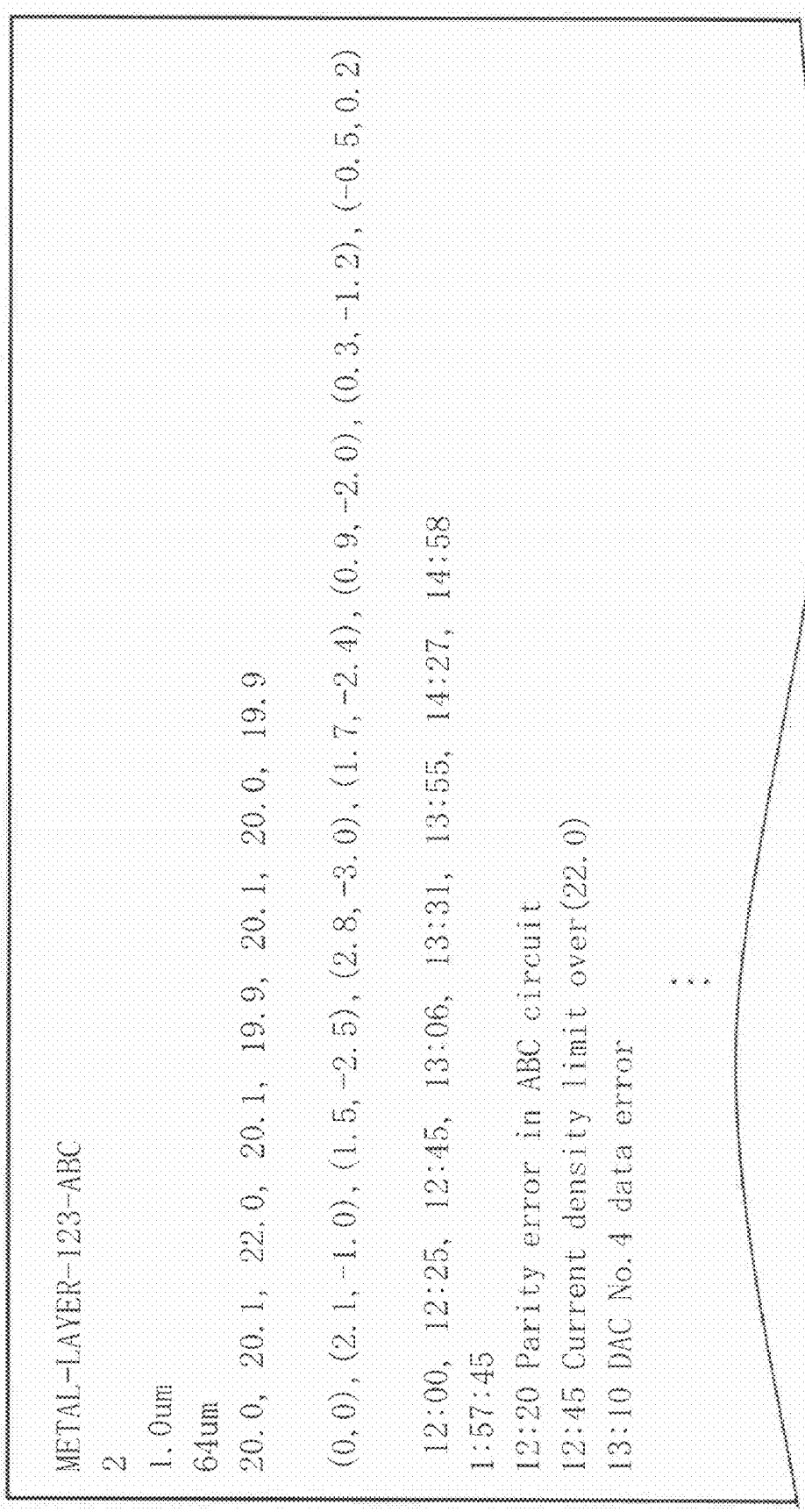
FIG. 7 shows an example of a writing information file according to Embodiment 1.

FIG. 7 shows an example of a writing information file according to Embodiment 1. In FIG. 7, a writing data name indicated as "METAL-LAYER-123-ABC" is defined in the writing information file. Then, information indicating a degree of multiplexing of writing shown as "2" is defined. Although herein the degree of multiplexing is 2, it is not limited thereto, and it should be understood that the degree of multiplexing may be 3 or more. Furthermore, the maximum shot size indicated as "1.0 µm" is defined, and a subfield size indicated as "64 µm" is also defined. In FIG. 7, since the writing data name, the degree of multiplexing of writing, the maximum shot size, and the subfield size are known before starting writing, they may be automatically generated by the pattern writing apparatus 100 or may be input by the operator through the K/B 122. Hereafter, information obtained from the log of after starting writing is defined. Specifically, the following information is defined as an example. "20.0, 20.1, 22.0 . . . (continuing)" of a current density during writing is defined in the writing information file. Furthermore, "(0, 0), (2.1, −1.0), (1.5, −2.5) . . . (continuing)" of a monitoring result of the beam position irradiated on the target workpiece 101 is defined. In this case, it is preferable to define the beam position by using coordinates. Moreover, "12:00, 12:25, 12:45 . . . (continuing)" of measurement time is defined. It is preferable to define the measurement time based on a sampling of a current density during writing and a monitoring result of the beam position irradiated by that current density. Further, a writing time indicated as "1:57:45" is defined in the writing information file. Furthermore, error information and its generation time are defined. In FIG. 7, for example, error information of "12:20 Parity error in ABC circuit" indicating that a parity check error of transmission data occurred is defined. For example, error information of "12:45 Current density limit over (22.0)" indicating that an alarm is generated because the current density has exceeded the maximum value (22.0) is also defined. Moreover, for example, error information of "13:10 DAC No. 4 data error" indicating that data error occurred in the DAC is also defined. Thus, the information generated after starting writing is defined in the writing information file.

In step S118, as a writing data generation step for writing result information codes, the writing data for codes generation unit 12 is input with writing information of when the target workpiece 101 is actually written, and then, based on the writing information, generates writing data of a figure code indicating the writing information. The writing data for codes generation unit 12 generates writing data of a figure code in the same format as that of chip writing data, based on the text data shown in the writing information file.

As mentioned above, after the pattern having been written, the writing data for codes generation unit 12 is input with the writing information of when the target workpiece 101 is written, and generates writing data of a figure code indicating the writing information, based on the writing information.

Figure 8:
FIG. 8 shows an example of a figure code according to Embodiment 1.
Figure 9:
FIG. 9 shows another example of the figure code according to Embodiment 1.

FIG. 8 shows an example of a figure code according to Embodiment 1. FIG. 9 shows another example of a figure code according to Embodiment 1. In FIG. 8, the case of generating a figure code 34 by using "QR Code" (registered trademark (R)) is shown. In FIG. 9, the case of generating a figure code 36 by also using "QR Code" (R) is shown. However, the standard for figure codes is not limited to "QR Code" (R). As mentioned above, the existing standards, such as "bar code", "PDF417", "DataMatrix", "Maxi", or "Code" may be used. As a figure code, a one-dimensional figure or a two-dimensional figure may be used. What is necessary is that a figure code, which is written based on generated writing data for figure codes, indicates writing information on the mask.

In step S120, as an inspection step, the inspection unit 16 inspects whether the writing data for figure codes overlaps with a chip pattern indicated by chip writing data and an ID figure indicated by ID writing data or not.

Figure 10A:
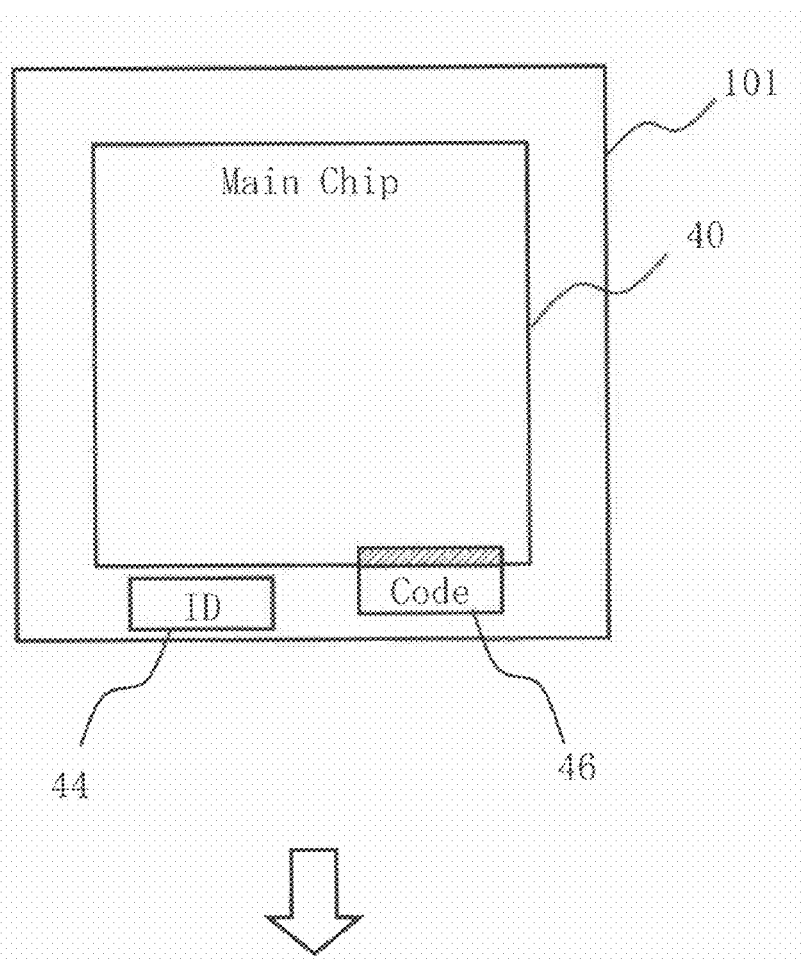
FIGS. 10A and 10B are schematic diagrams for explaining contents of inspection according to Embodiment 1.
Figure 10B:
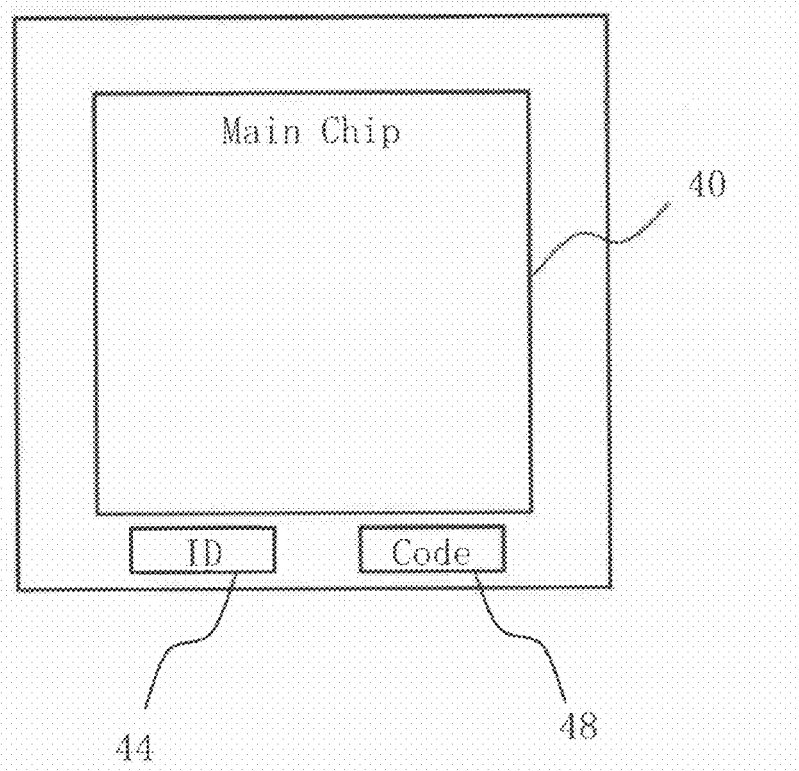

FIGS. 10A and 10B are schematic diagrams for explaining the contents of inspection according to Embodiment 1. FIG. 10A shows the state where a figure code 46 overlaps with the chip frame 40 of the target workpiece 101. In this case, the inspection unit 16 judges to be NG (no good) as an inspection result. Then, it goes to step S122. On the other hand, FIG. 10B shows the state where a figure code 48 does not overlap with the chip frame 40 of the target workpiece 101. In this case, the inspection unit 16 judges to be OK as an inspection result. Then, it goes to step S124. This overlap inspection may be performed based on synthesized writing data, which has already been used for writing, and on writing data for figure codes, which is generated this time. As another method, it is also suitable that the inspection unit 16 is input with frame information on a pattern to be written on the target workpiece, such as a chip frame size and a reference position of the chip frame defined in the JOB file 20, and inspects whether the chip pattern overlaps with the figure code or not, based on the chip frame size, the reference position of the chip frame, the reference position of the figure code, and the figure code size defined in the generated writing data for figure codes. Moreover, the inspection unit 16 may inspect whether the ID figure overlaps with the figure code or not, based on the reference position of the ID figure, the ID figure size, the reference position of the figure code and the figure code size.

In step S122, as a coordinate/size correction step, when the figure code 46 overlaps with the chip frame 40 or the ID FIG. 44, the coordinate/size correction unit 18 corrects the reference position of the figure code or the figure code size defined in the JOB file 20. After correcting the data of the JOB file 20, it returns to step S118. Repeating each step from S118 to S122 mentioned above, correction is automatically performed so that the figure code 48 may not overlap with the chip frame 40 as shown in FIG. 10B.

In step S124, as a writing data processing step, the writing data processing unit 110 converts, by performing several conversion process steps, the writing data of the figure code to data of the format of the pattern writing apparatus 100.

In step S126, as a writing step, the writing unit 150 further writes a figure code onto the target workpiece 101, on which a pattern and an ID figure have already been written, based on the writing data of the figure code, by using data whose processing has been completed based on the writing data of the figure code. The writing operation is the same as that mentioned above.

Owing to the structure described above, the writing information of when the target workpiece 101 is written can be written together with the pattern.

According to the present Embodiment, as mentioned above, information of when writing, which can be known only after starting writing, can be written as a figure code on the target workpiece.

Figure 11:
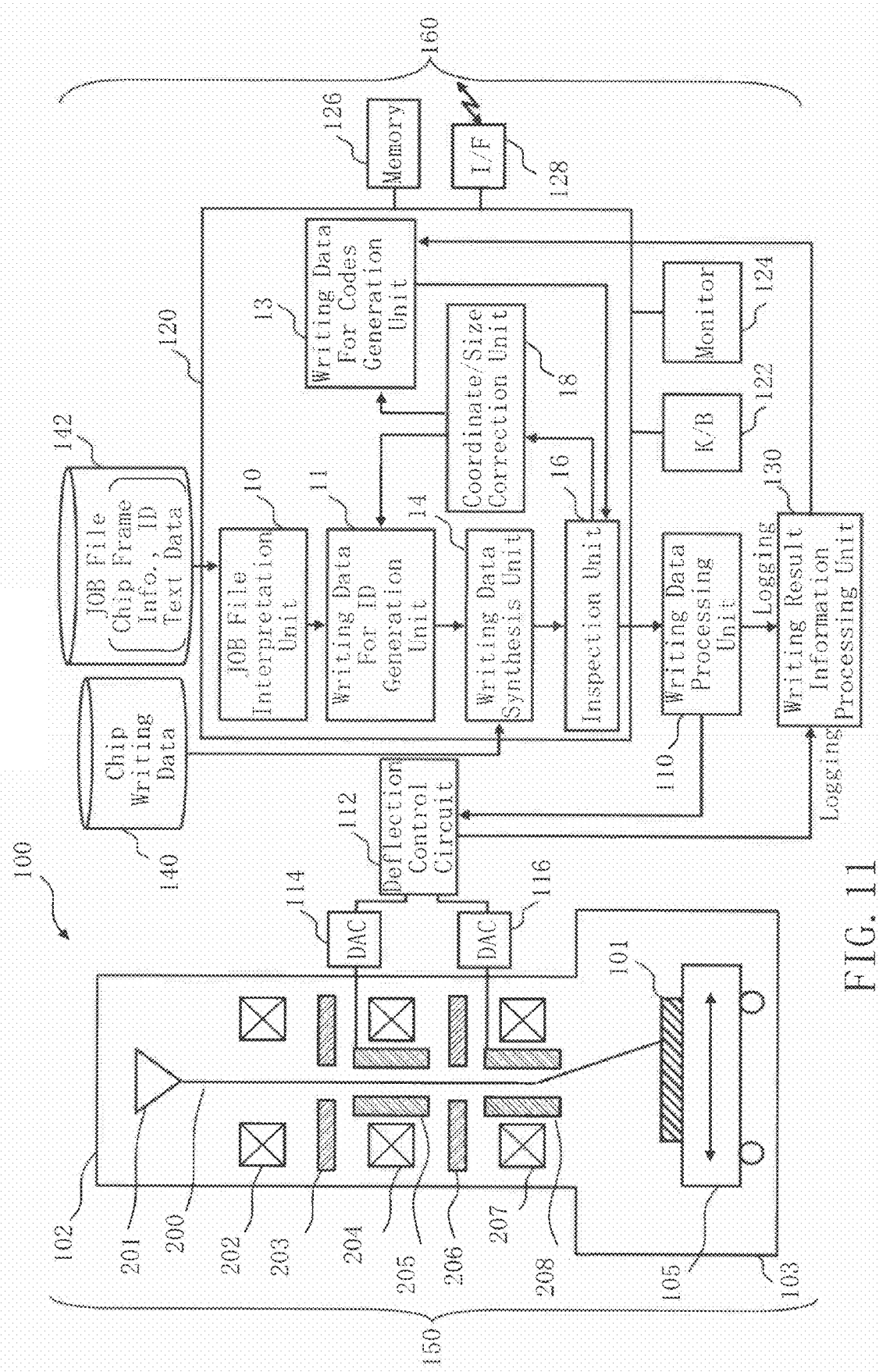
FIG. 11 is a schematic diagram showing another structure of the pattern writing apparatus according to Embodiment 1.
Figure 12:
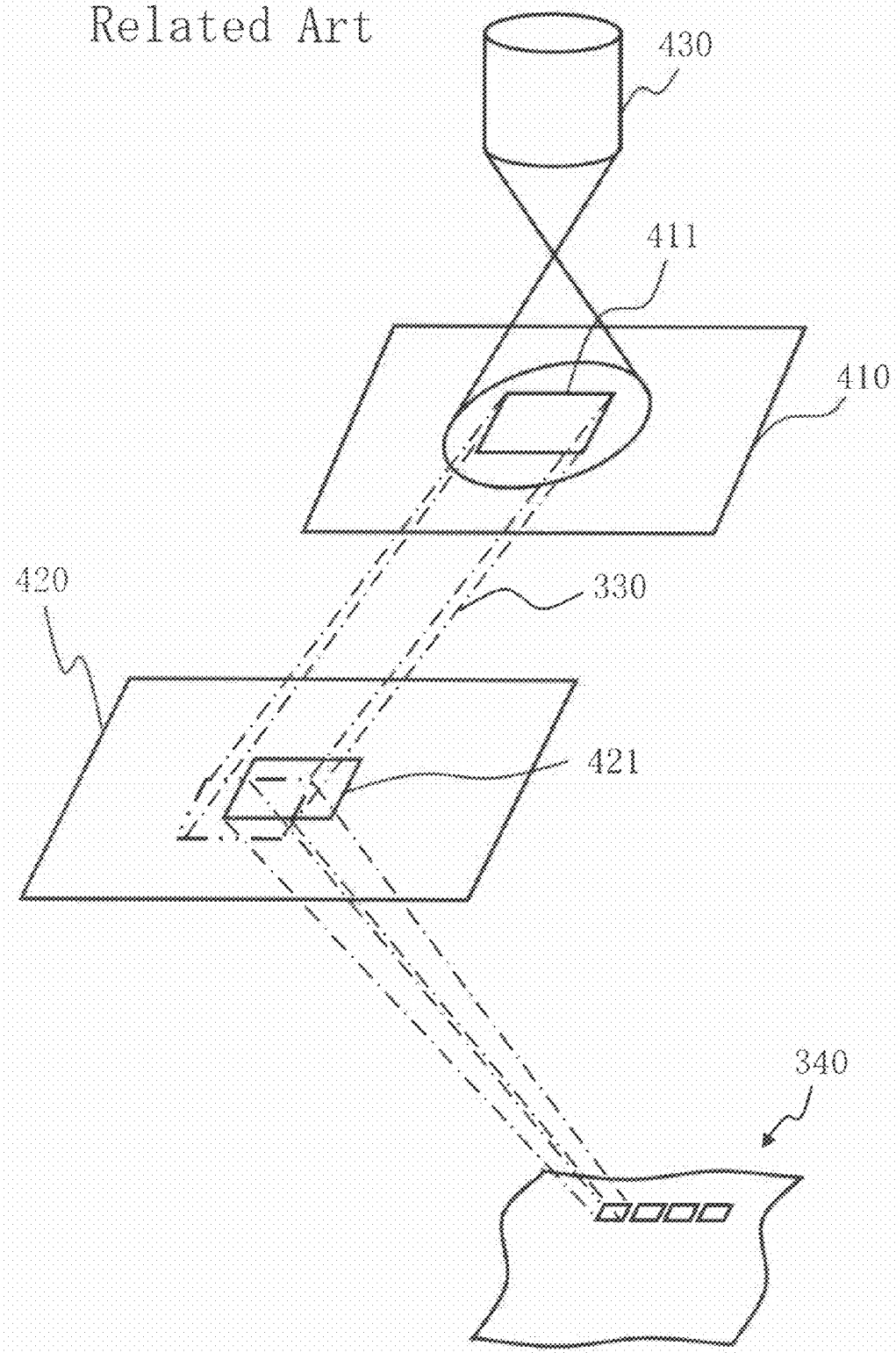
FIG. 12 is a schematic diagram showing operations of a variable-shaped electron beam type writing apparatus.

Although, in FIG. 1, writing data for ID figures and writing data for figure codes are generated in the same writing data for codes generation unit 12, it is not limited thereto. FIG. 11 is a schematic diagram showing another structure of the pattern writing apparatus according to Embodiment 1. FIG. 11 is the same as FIG. 1 except for dividing the writing data for codes generation unit 12 into an ID writing data generation unit 11 (writing data for ID generation unit) which generates writing data for ID figures and a writing data for codes generation unit 13 which generates writing data for figure codes. In the control computer 120 of FIG. 11, there are arranged the JOB file interpretation unit 10, the ID writing data generation unit 11, the writing data for codes generation unit 13, the writing data synthesis unit 14, the inspection unit 16, and the coordinate/size correction unit 18. Accordingly, it is also preferable to generate writing data by using different generation units. As to the operation of the pattern writing apparatus 100, it can be understood by regarding the writing data for codes generation unit 12 as the ID writing data generation unit 11 or as the writing data for codes generation unit 13 in the description mentioned above. In FIG. 11, processing of each function, such as the JOB file interpretation unit 10, the ID writing data generation unit 11, the writing data for codes generation unit 13, the writing data synthesis unit 14, the inspection unit 16 and the coordinate/size correction unit 18 in the control computer 120 may be implemented by software. Alternatively, each function of them may be configured by hardware such as an electric circuit. Alternatively, they may be executed by a combination of hardware and software, or a combination of hardware and firmware. When implemented by software or a combination of software and hardware etc., data to be input into the writing control computer 120 or each data being processed or having been processed is stored in the memory 126 each time.

What is expressed by the term "unit" or "step" in the description above can be configured by computer programs. They may be implemented by software programs executed by the computer system. Alternatively, they may be executed by a combination of hardware and software, or a combination of hardware and firmware. When constituted by a program, the program is stored in a computer readable recording medium, such as a magnetic disk drive, a magnetic tape drive, FD, CD, DVD, MO, or ROM. For example, the program is stored in the memory 126. Alternatively, it is sufficient that at least one of these recording media is connected to the control computer 120 or the writing data processing unit 110, or to the inside of the control computer 120 or the writing data processing unit 110.

While the embodiments have been described with reference to specific examples, the present invention is not limited thereto.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other writing method and writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing apparatus comprising:
   a writing unit configured to write a pattern onto a target workpiece, based on a writing data of the pattern to be written on the target workpiece; and
   a generation unit configured to generate, after the pattern has been written, writing data of a figure code indicating a writing information of when the target workpiece is written, based on the writing information,
   wherein the writing unit further writes the figure code onto the target workpiece, based on the writing data of the figure code.

2. The apparatus according to claim 1, wherein the writing information includes at least one of a current density during writing, a beam position, a writing time, and error information.

3. The apparatus according to claim 1, further comprising:
   an inspection unit configured to inspect whether the figure code overlaps with the pattern.

4. The apparatus according to claim 3, further comprising:
   a correction unit configured to correct the figure code so that the figure code does not overlap with the pattern.

5. The apparatus according to claim 1, wherein the generation unit further inputs text data specifying a shape of an identification figure which indicates identification information of the target workpiece, and generates writing data of the identification figure, based on the text data.

6. A writing method comprising:
inputting writing data of a pattern to be written onto a target workpiece, and writing the pattern onto the target workpiece, based on the writing data;
inputting, after the writing the pattern, writing information of when the target workpiece is written, and generating writing data of a figure code indicating the writing information, based on the writing information; and
writing the figure code onto the target workpiece, based on the writing data of the figure code.

7. The method according to claim 6, wherein the writing information includes at least one of a current density during writing, a beam position, a writing time, and error information.

8. The method according to claim 6, further comprising:
inspecting, before the writing the figure code, whether the figure code overlaps with the pattern.

9. The method according to claim 8, further comprising:
correcting the figure code in a case where the figure code overlaps with the pattern.

10. The method according to claim 6, further comprising:
inputting, before the wiring the pattern, text data specifying a shape of an identification figure which indicates identification information of the target workpiece, and generating writing data of the identification figure, based on the text data.

* * * * *